(12) United States Patent
Flynn et al.

(10) Patent No.: US 7,282,744 B2
(45) Date of Patent: Oct. 16, 2007

(54) III-NITRIDE OPTOELECTRONIC DEVICE STRUCTURE WITH HIGH AL ALGAN DIFFUSION BARRIER

(75) Inventors: Jeffrey S. Flynn, Litchfield, CT (US); Huoping Xin, Brea, CA (US); George R. Brandes, Southbury, CT (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/840,515

(22) Filed: May 6, 2004

(65) Prior Publication Data
US 2004/0222431 A1    Nov. 11, 2004

Related U.S. Application Data

(60) Provisional application No. 60/469,316, filed on May 9, 2003.

(51) Int. Cl.
*H01L 29/22*    (2006.01)
(52) U.S. Cl. ............ 257/94; 257/96; 257/102; 257/103; 372/43.01
(58) Field of Classification Search .......... 257/94, 257/96, 102, 103; 372/43.01
See application file for complete search history.

(56) References Cited

U.S. PATENT DOCUMENTS

| | | | |
|---|---|---|---|
| 4,614,961 A | 9/1986 | Khan et al. | |
| 6,153,894 A * | 11/2000 | Udagawa | 257/96 |
| 6,194,743 B1 | 2/2001 | Kondoh et al. | |
| 6,222,207 B1 | 4/2001 | Carter-Coman et al. | |
| 6,511,876 B2 * | 1/2003 | Buchanan et al. | 438/240 |
| 6,548,405 B2 * | 4/2003 | Kraus et al. | 438/688 |
| 6,656,823 B2 | 12/2003 | Lee et al. | |
| 6,800,876 B2 * | 10/2004 | Edmond et al. | 257/94 |

FOREIGN PATENT DOCUMENTS

JP    10-321042    * 12/1998

* cited by examiner

*Primary Examiner*—Sara Crane
(74) *Attorney, Agent, or Firm*—Vincent K. Gustafson; Intellectual Property / Technology Law

(57) ABSTRACT

A III-nitride electronic device structure including doped material, an active region and a barrier material arranged to suppress transport of dopant from the doped material into the active region, wherein the barrier material comprises high-Al content $Al_xGa_yN$, wherein $x+y=1$, and $x \geq 0.50$. In a specific aspect, AlN is used as a migration/diffusion barrier layer at a thickness of from about 5 to about 200 Angstroms, to suppress flux of magnesium and/or silicon dopant material into the active region of the III-nitride electronic device, e.g., a UV LED optoelectronic device.

30 Claims, 3 Drawing Sheets

III-NITRIDE OPTOELECTRONIC DEVICE STRUCTURE WITH HIGH AL ALGAN DIFFUSION BARRIER

CROSS-REFERENCE TO RELATED APPLICATION

The priority of U.S. provisional patent application Ser. No. 60/469,316 filed May 9, 2003 in the names of Jeffrey Flynn, Huoping Xin and George Brandes for "III-Nitride Optoelectronic Device Structure with High Al AlGan Diffusion Barrier" hereby is claimed under the provisions of 35 USC §119(e).

BACKGROUND OF THE INVENTION

1. Field of the Invention

This invention relates to III-nitride electronic and optoelectronic devices, and specifically to III-nitride electronic and optoelectronic device structures having a diffusion barrier of high-Al content $Al_xGa_yN$, wherein $x+y=1$, and $x \geq 0.50$, and to methods of making same. The high-Al content $Al_xGa_yN$ layer permits electronic and optoelectronic devices to be manufactured that are uncompromised by migration or diffusion of dopant species (e.g., magnesium, silicon, etc.) into the active device region, during the high temperature fabrication steps involving in the manufacture of such electronic and optoelectronic devices, including epitaxial growth and device fabrication.

2. Description of the Related Art

In the manufacture of III-nitride optoelectronic devices, commonly employed dopants such as silicon and magnesium readily migrate or diffuse into active regions of the device structure during high temperature processing conditions such as metalorganic chemical vapor deposition (MOCVD) and post-deposition fabrication operations. Such transport of the dopant species into the active region is severely detrimental to the ultimate performance and efficiency of the III-nitride optoelectronic device.

Specifically, the transport of dopant species into the active region of the optoelectronic device will reduce the luminous efficiency of the device due to formation of non-radiative centers, as well as radiative centers with undesirable wavelength characteristics (i.e., deviations from the desired emission wavelength), and the development of micro-morphological defects, which in turn substantially reduce the efficiency of the product device.

Further, such transport of dopant species into the active region, and the defects that resultantly develop in the device, lead to shortened product life, as a consequence of excessive heat generation during operation, attributable to the presence of dopant contamination of the active region.

These problems associated with dopant transport into the active region of III-nitride optoelectronic devices during their fabrication has motivated study and efforts to modify the optoelectronic device architecture. See, for example, Chang, Ying-Lan, et al., "Study of Mg Diffusion During Metalorganic Chemical Vapor Deposition of GaN and AlGaN," Applied Physics Letters, Vol. 74, No. 5, pp. 688-690: Japanese Patent Publication 2001-36196, published Feb. 9, 2001; and Japanese Patent Publication 2001-77480, published Mar. 23, 2001. The disclosures of these various references are hereby incorporated herein by reference, in their respective entireties.

Despite such prior study and attempts to overcome problems associated with migration and diffusion of dopant species into active areas of the optoelectronic device, the art is still in need of an effective solution to such problem. Such solution desirably is readily implementable in the manufacturing process of the III-nitride optoelectronic device, highly effective in avoiding migratory or diffusional contamination of the active region of the optoelectronic device structure, and cost-effective.

SUMMARY OF INVENTION

The present invention relates to III-nitride electronic and optoelectronic devices, and methods of making same.

In one aspect, the invention relates to a III-nitride electronic device structure including doped material, an active region and a barrier material arranged to suppress transport of dopant from the doped material into the active region, wherein the barrier material comprises high-Al content $Al_xGa_yN$, wherein $x+y=1$, and $x \geq 0.50$.

Another aspect of the invention relates to a III-nitride optoelectronic device structure comprising a doped III-nitride layer and an active region, wherein a barrier layer is disposed between the doped III-nitride layer and the active region, such barrier layer being formed of a material comprising AlGaN having at least 50% Al, based on the total amount of Al and Ga, therein, whereby the AlGaN layer provides a barrier to migration or diffusion of dopant species from the doped III-nitride layer into the active region of the device.

Yet another aspect of the invention relates to a method of forming a III-nitride optoelectronic device structure including an active region and a doped III-nitride layer overlying the active region, such method comprising forming an AlGaN layer intermediate the active region and doped III-nitride layer, to form a barrier layer for suppressing migration or diffusion of dopant from the doped III-nitride layer into the active region.

In another aspect, the invention relates to a method of producing a highly doped region in a microelectronic device structure including a doped material and an active region material, such method comprising (i) forming an intermediate layer between the doped material and the active region material to produce an interfacial region of increased strain, in relation to a corresponding microelectronic device structure lacking such intermediate layer and wherein the doped material and active region material are contiguous to one another, and (ii) effecting transport of dopant from the doped material toward the active region material so that dopant is accumulated in such interfacial region of increased strain.

An additional aspect of the invention relates to a method of engineering a III-nitride device including doped and active regions, with respect to band energy structures of the device, such method comprising interposing between the doped and active regions a layer comprising high-Al content $Al_xGa_yN$, wherein $x+y=1$, and $x \geq 0.50$, wherein x, y, interposed layer thickness, and interposed layer forming conditions are selected to yield the III-nitride device with predetermined band energy structures.

A further aspect of the invention relates to a method of engineering tunneling probability of carriers in an impurity diffusion barrier layer of a III-nitride device including doped and active regions having the impurity diffusion barrier layer therebetween, such method comprising forming as the impurity diffusion barrier layer a layer comprising high-Al content $Al_xGa_yN$, wherein $x+y=1$, and $x \geq 0.50$, wherein x, y, impurity diffusion barrier layer thickness, and impurity diffusion barrier layer forming conditions are selected to yield the III-nitride device with a predetermined engineering tunneling probability of carriers in the impurity diffusion barrier layer.

Yet another aspect of the invention relates to a multiple quantum well UV LED structure including a Mg-doped p-AlGaN layer, an active region, and a magnesium diffusion barrier layer therebetween, wherein the magnesium diffusion barrier layer comprises AlN.

Other aspects, features and advantages of the invention will be more fully apparent from the ensuing disclosure and appended claims.

DETAILED DESCRIPTION OF THE INVENTION, AND PREFERRED EMBODIMENTS THEREOF

The present invention is based on the discovery that migration and/or diffusion of dopants (e.g., Si, Mg, Be, Fe, Zn, O, Ge, etc.) into active regions of III-nitride optoelectronic device structures can be substantially reduced or even eliminated by fabricating the device structure with a barrier material comprising high-Al content $Al_xGa_yN$, wherein $x+y=1$, and $x \geq 0.50$, where the barrier material is arranged to protect the active region of the device structure from contaminating transport of the dopant involving migration or diffusion of the dopant into the active region.

The $Al_xGa_yN$ barrier material has high Al concentration, comprising at least 50% and up to (and including) 100% Al concentration, based on total aluminum and gallium content. Such high Al content $Al_xGa_yN$ material has been discovered to effectively inhibit diffusion and migration of dopant species from doped layers into the active region of the III-N optoelectronic device structure. Barrier layers formed of such material are particularly effective in suppressing contamination of the active region by dopant species such as magnesium and silicon.

The $Al_xGa_yN$ barrier in the broad practice of the invention is readily formed by any suitable thin film formation techniques, including vapor deposition techniques such as metalorganic chemical vapor deposition (OCVD), molecular beam epitaxy (MBE), hydride vapor phase epitaxy (HVPE), etc., at appropriate process conditions therefore, as part of the process flow sequence for the manufacture of the product III-nitride optoelectronic device.

As a specific comparative example, the formation of a layer of AlN at a thickness of approximately 30 Angstroms between the active region and p-AlGaN cladding of a UV-LED device structure fabricated to operate at a UV wavelength of 340 nanometers (nm), has been demonstrated to effectively suppress magnesium (Mg) diffusion into the active region from the top p-cladding layer of the device, in relation to a corresponding UV-LED device structure lacking such AlN barrier layer.

Figure 1:
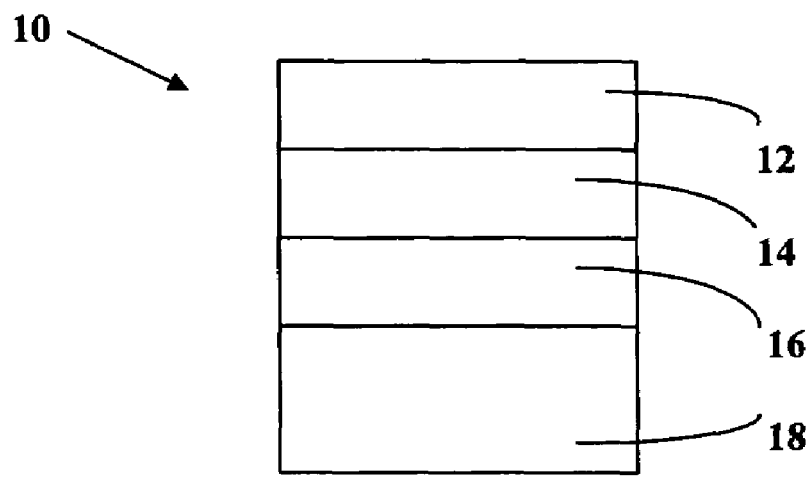
FIG. 1 is a schematic representation of the layer structure of an ultraviolet light emitting diode (UV-LED) comprising successive layers of N-AlGaN, active region material and p-AlGaN on a substrate.

FIG. 1 is a schematic representation of the layer structure of an ultraviolet light emitting diode (UV-LED) structure 10 comprising successive layers of N-AlGaN 16, active region material 14 and p-AlGaN 12 on a substrate 18. The substrate 18 can be of any suitable type, e.g., sapphire, spinel, SiC, GaN, etc. Contacts can be placed on the backside layer 18 or layer 12 to form the contact elements for the device.

Figure 2:
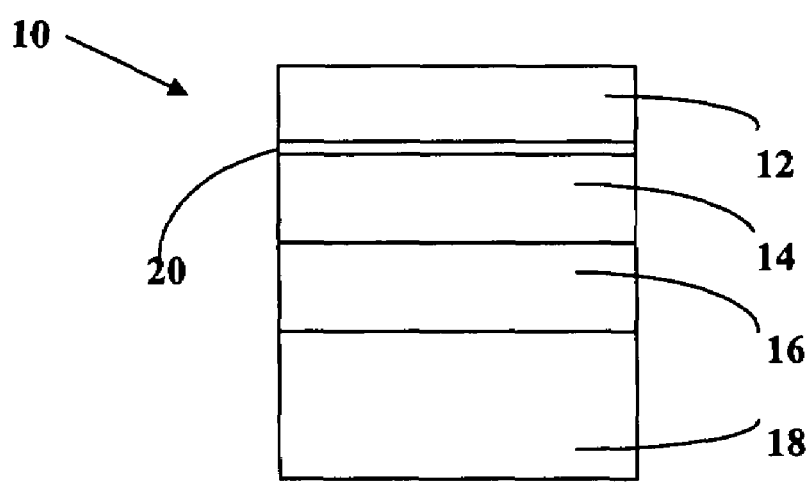
FIG. 2 is a schematic representation of the layer structure of a UV-LED structure similar to that of FIG. 1, but utilizing an AlN barrier layer between the active region and p-AlGaN layer.

FIG. 2 is a schematic representation of the layer structure of a UV-LED structure similar to that of FIG. 1, wherein the same layers are corresponding numbered but utilizing an AlN barrier layer 20 between the active region 14 and p-AlGaN layer 12 of the structure 10.

Figure 3:
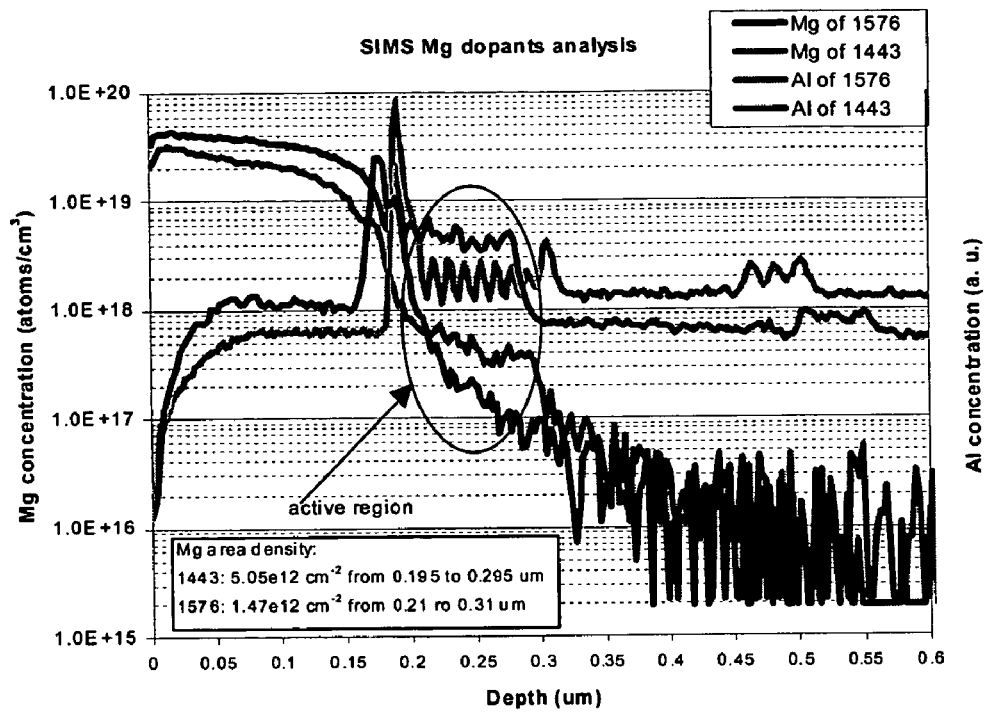
FIG. 3 is a graph of concentration of magnesium and aluminum atoms as a function of depth in UV-LED samples, with and without the AlN barrier layer in respective comparative samples, as determined by secondary ion mass spectroscopy (SIMS), showing the effectiveness of the AlN barrier layer.

FIG. 3 is a graph of concentration of magnesium and aluminum atoms as a function of depth in these UV-LED samples, with and without the AlN barrier layer in the respective comparative samples. The dopant analysis results shown in FIG. 3 were determined by secondary ion mass spectroscopy (SIMS), and show the effectiveness of the AlN barrier layer.

In the respective device structures of the types shown in FIG. 1 and FIG. 2, the magnesium area density in the active region of the device structure containing no AlN layer was $5.1 \times 10^{12}$ $cm^{-2}$, while the magnesium area density in the active region of the corresponding device structure that included an AlN layer between the active region and p-AlGaN cladding, was $1.5 \times 10^{12}$ $cm^{-2}$.

These empirically determined values, while showing the efficacy of the AlN barrier layer in suppressing Mg dopant contamination of the active area of the device, understate the relative effectiveness of the suppression effect, since the magnesium dopant concentration in the p-cladding layer of the device structure containing the AlN barrier layer was 30% higher than the concentration of Mg dopant in the p-cladding layer of the device structure lacking such AlN barrier layer.

High levels of magnesium incorporation in the AlGaN layer is enabled by the high-Al barrier layer structure of the invention, thereby permitting higher Mg concentration levels to be obtained with higher device performance, than is currently possible.

The invention provides a migration/diffusion barrier layer that enables higher dopant densities to be implemented in doped materials of device structures without the attendant problems of dopant contamination in the active region of the device attributable to migration/diffusion of the dopant at elevated temperatures in the fabrication of the microelectronic device structure, such as are encountered in the conventional manufacture of optoelectronic devices lacking the barrier layer of the present invention.

As a result of the suppression of the transport of dopant into the active region of the device, the barrier layer structure of the present invention enables III-nitride optoelectronic devices to be manufactured that have substantially improved device lifetimes, higher luminous efficiency and lower heat production in operation than are achievable in corresponding optoelectronic devices lacking the migration/diffusion barrier layer of the present invention.

When the aforementioned UV LED article having an AlN migration/diffusion barrier layer was subjected to empirical characterization, analysis of magnesium concentration revealed localized magnesium accumulation at the interface of the barrier layer and the p-AlGaN layer.

This localization of magnesium was consistent with differences in micro-morphology and physical properties (e.g., crystal structure differences, strain differentials, etc) between the barrier layer material and the p-AlGaN material that contact one another at the barrier layer/p-AlGaN interface. The Mg that accumulated at the p-AlGaN and $Al_xGa_yN$ barrier interface yielded a superimposed, Gaussian-like dopant profile in the SIMS data.

By contrast, in the corresponding UV LED device structure without an $Al_xGa_yN$ barrier layer, diffusion of magnesium atoms into the active region of the UV LED structure produced a slightly tapered concentration profile at depths of 0.2 to 0.3 micrometers (as measured from the surface into the active region). The concentration dropped by only approximately 30% in one case.

The foregoing shows that the dopant species accumulated in the interfacial region where a high degree of strain or other material differences can be present. Such dopant accumulation behavior thus provides a means for obtaining a highly doped region for contact formation.

Additionally, such interfacial region dopant accumulation behavior can be utilized to effect channel definition or to remove dopants from a layer without removing the associated charge contribution, as a technique for optimizing the performance of the optoelectronic device.

Further, the interfacial region dopant accumulation behavior of the dopant species can be utilized for introducing dopants into a layer in a positionally fixed manner.

The provision of a $Al_xGa_yN$ migration/diffusion barrier layer in accordance with the present invention facilitates engineering of the device structure with respect to band structures of the III-nitride device (e.g., (Al,Ga,In)N and other nitride alloy devices, where (Al,Ga,In) represents any stoichiometrically appropriate nitrides whose metal moiety includes one or more of aluminum, gallium and aluminum). The use of an $Al_xGa_yN$ migration/diffusion barrier layer in accordance with the present invention also permits engineering of the tunneling probability of carriers in the impurity diffusion barrier layer.

Figure 4:
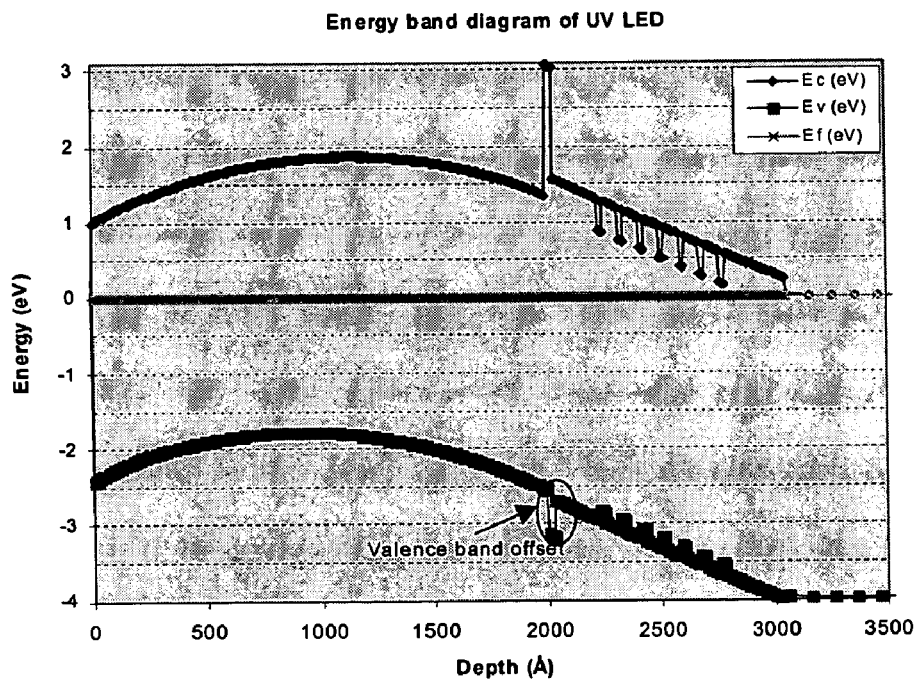
FIG. 4 is an energy band diagram of a (MQW) UV LED device structure with an AlN layer inserted between the active region and p-cladding layer of the structure.

A simplified depiction of a band diagram, without adjustment for piezoelectric effects, is shown in FIG. 4 for a multiple quantum well (MQW) UV LED structure having an AlN magnesium diffusion barrier layer between the p-AlGaN layer and the active region.

It is evident from FIG. 4 that the valence band offset due to the presence of the AlN layer will impede hole transport if not properly engineered. Proper engineering entails consideration of the band structure of the impurity diffusion barrier layer (including stoichiometry of the respective layers), the thickness of the respective layers, and the energy of the carrier (based, for example, on consideration of the drive voltage of the optoelectronic device).

The tunneling probability (T) of a particle through a square barrier is set out by equation (1) below $$T = \frac{4k^2k'^2}{(k^2 + k'^2)Sh^2(k'a) + 4k^2k'^2} \qquad \text{Equation (1)}$$

where $$k = \sqrt{\frac{2mE}{h^2}} \qquad \text{Equation (2)}$$

and where $$k' = \sqrt{\frac{2m(V_0 - E)}{h^2}} \qquad \text{Equation (3)}$$

and $V_0=\Delta E_v$, the valence band offset between AlN and the adjacent AlGaN layer, a=thickness of the Al layer, h=Planck constant, m=hole effective mass in the adjacent AlGaN layer, E=energy of the carrier (~drive voltage of the optoelectronic device).

Assuming $k'a \geqq 1$, equation (1) can be simplified as $$T \approx \frac{16E(V_0 - E)}{V_0^2} e^{\frac{2a}{h}\sqrt{2m(V_0-E)}} \qquad \text{Equation (4)}$$

It is clear from equation (4) that T is reduced exponentially with increasing barrier thickness. Due to unknown hole effective mass in the AlGaN layer, it is difficult to determine an exact tunneling probability as a function of AlN thickness. Nonetheless, relative comparisons are useful in assessing the advantages of the barrier layer in the optoelectronic device structures of the present invention.

Figure 5:
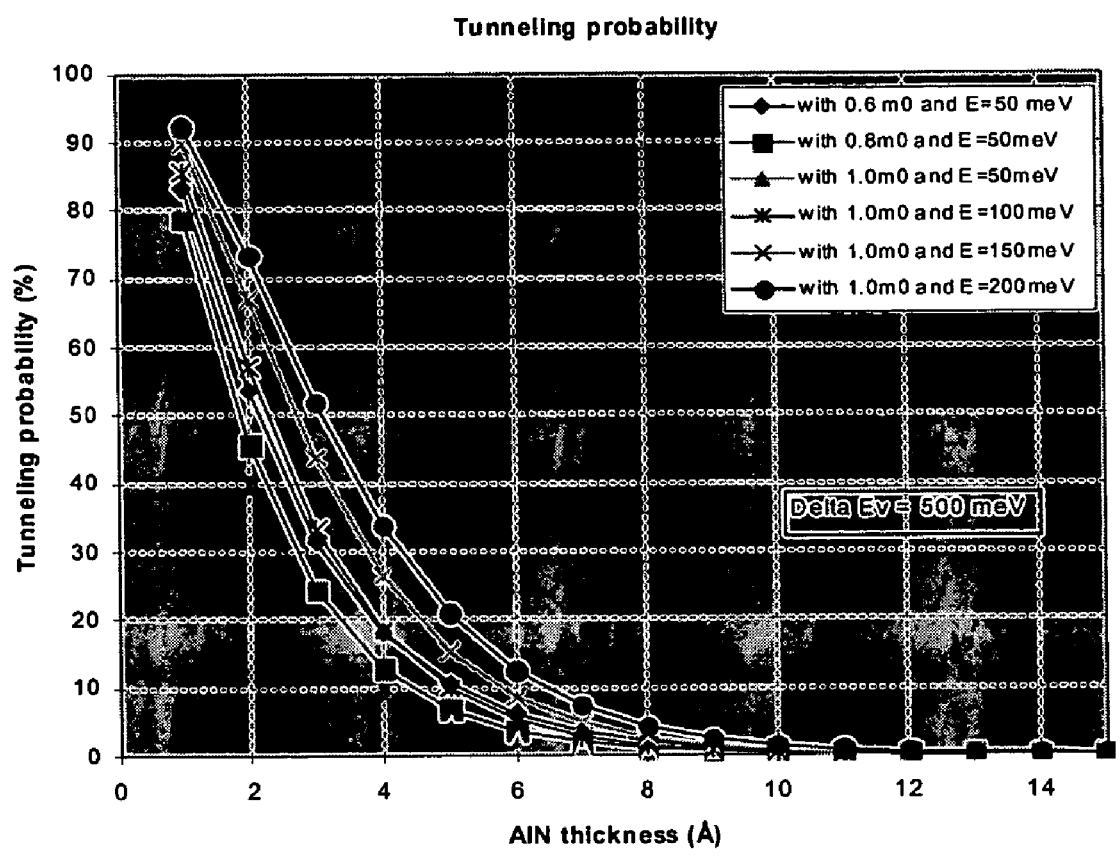
FIG. 5 is a graph of tunneling probability (%) as a function of AlN thickness in Angstroms, for different relative effective masses (m0) and hole energies (E).

Simulations of tunneling probability as a function of AlN thickness for different values of hole effective mass (m0) with different hole energy (E) are shown in FIG. 5.

Referring to FIG. 5, for a constant barrier height (of the AlN barrier layer), the optimal AlN thickness can readily be determined, which will increase the hole tunneling probability while effectively suppressing dopant diffusion into the active region.

By way of example, a monolayer of AlN with thickness on the order of 2.5 Angstroms yields a hole tunneling probability of over 40% for m0=1.0 and E=50 meV. Further, increasing the drive voltage of the device (i.e., E), causes the tunneling probability to be substantially increased, by about 20% in the specific example considered. Thus, very low thickness of the barrier layer can be employed to prevent migration/diffusion of magnesium and other dopant species.

Consistent with the foregoing, the invention contemplates in another aspect a method of producing a highly doped region in a microelectronic device structure including a doped material and an active region material, such method comprising (i) forming an intermediate layer between the doped material and the active region material to produce an interfacial region of increased strain, in relation to a corresponding microelectronic device structure lacking such intermediate layer and wherein the doped material and active region material are contiguous to one another, and (ii) effecting transport of dopant from the doped material toward the active region material so that dopant is accumulated in the interfacial region of increased strain.

The intermediate layer in such methodology preferably comprises high-Al content $Al_xGa_yN$, wherein x+y=1, and x≧0.50. The microelectronic device structure can be of any suitable type, e.g., a III-nitride optoelectronic device structure, comprising a III-nitride material, and the dopant can include any suitable species, e.g., Si, Mg, Be, Fe, Zn, O, Ge, etc.

In such method of producing a highly doped region in a microelectronic device structure, the step (ii) of transport of dopant from the doped material toward the active region material is utilized to effect channel definition of the microelectronic device structure.

Such step (ii) of transport of dopant from the doped material toward the active region material can in another aspect be carried out for sufficient time to remove dopant from the doped material without removing the charge contribution associated with the dopant.

The step (ii) of transport of dopant from the doped material toward the active region material, so that dopant is accumulated in the interfacial region of increased strain, can be effected by an elevated temperature condition that is kinetically favorable for such transport of the dopant.

The invention contemplates in another aspect a method of engineering a III-nitride device including doped and active regions, with respect to band energy structures of the device, such method comprising interposing between the doped and active regions a layer comprising high-Al content $Al_xGa_yN$, wherein x+y=1, and x≧0.50, wherein x, y, interposed layer thickness, and interposed layer forming conditions are selected to yield the III-nitride device with predetermined band energy structures.

A further aspect of the invention contemplates a method of engineering tunneling probability of carriers in an impurity diffusion barrier layer of a III-nitride device including doped and active regions having such impurity diffusion barrier layer therebetween. The method comprises forming as the impurity diffusion barrier layer a layer comprising high-Al content $Al_xGa_yN$, wherein x+y=1, and x≧0.50, wherein x, y, impurity diffusion barrier layer thickness, and impurity diffusion barrier layer forming conditions are selected to yield the III-nitride device with a predetermined engineering tunneling probability of carriers in the impurity diffusion barrier layer.

In a further specific device aspect, the invention contemplates a multiple quantum well UV LED structure including a Mg-doped p-AlGaN layer, an active region, and a magnesium diffusion barrier layer therebetween, wherein the magnesium diffusion barrier layer comprises AlN.

The approach of the present invention, while described hereinabove in connection with the use of p-type layers, can also be utilized in n-layers.

In general, the barrier approach of the present invention is usefully employed in a wide variety of microelectronic devices, including, without limitation, blue light-emitting diodes (LEDs), green LEDs, blue laser diodes (LDs), UV LEDs, UV LDs, heterojunction bipolar transistors (HBTs), etc.

The thickness of the high-Al content $Al_xGa_yN$ layer can be widely varied in the broad practice of the present invention, as is readily determinable by those skilled in the art without undue experimentation. In specific applications, thicknesses in a range of from about 5 to about 200 Angstroms in thickness can be advantageously employed to suppress migration/diffusion of dopant species. In other applications, the thickness of the barrier layer is desirably in a range of from about 10 Angstroms to 100 Angstroms, more preferably from about 10 to about 75 Angstroms, and most preferably from about 10 to about 60 Angstroms.

Barrier layers in accordance with the invention include material of the formula $(Al_xGa_y)N$ wherein x+y=1, and x is in a range of from about 0.5 to 1. In specific embodiments utilizing barrier layers in accordance with the present invention, the value of x can be at least 0.60, 0.75, 0.80, 0.90 or 0.95. The minimum aluminum concentration required depends in part on the device processing requirements and in particular, the thermal budget for the device (time and temperature). The specific composition and amount of aluminum necessary in the barrier layer for effective migrative and diffusional resistance in a given application of the invention is readily determinable within the skill of the art, based on the disclosure herein.

Illustrative process conditions that are usefully employed for barrier layer growth in accordance with the invention include temperature in a range of from about 900 to about 1500° C., pressure in a range of from about 1 to about 1000 torr, V/III ratio in a range of from about 1 to about 100,000 and growth rates of about 0.01 um/hr to 10 um/hr.

The features and advantages of the invention are more fully shown by the following non-limiting example.

EXAMPLE 1

The following provides a specific example of growth conditions for a UV LED device fabricated in accordance with the present invention.

Step 1) Grow>0.05 um AlGaN n-layer (Al%>5, Si doping>5e17cm-3) at T=1220° C., P=100 mbar, V/III=2500 and growth rate of 1.5 um/hr;

Step 2) Growth<2000 Angstrom AlGaN MQW active region (Al%>1, doped or undoped) at T=1220° C., P=100 mbar, V/III=2500 and growth rate of 1.5 um/hr;

Step 3) Grow 30 Angstrom AlN barrier layer (Al%>50, doped or undoped) at T=1220° C., P=100 mbar, V/III=2500 and growth rate of 0.18 um/hr; and Step 4) Grow<0.5 um AlGaN p-layer (Al%>5, Mg doping>1e19cm-3) at T=1220° C., P=100 mbar, V/III=2500 and growth rate of 1.5 um/hr.

The high-Al AlGaN barrier layer technology of the invention is usefully employed to fabricate III-nitride electronic device structures in which migration and/or diffusion of unwanted material, e.g., dopant species, into active regions of the III-nitride device structure is substantially reduced or even eliminated by the provision of such barrier layer. Such barrier layer structure enables the fabrication of highly efficient electronic devices, such as optoelectronic devices having substantially improved device lifetimes, higher luminous efficiency and lower heat production and operation, relative to corresponding optoelectronic devices lacking the barrier layer structure of the invention. In specific applications, the barrier layer structures of the invention may be utilized to engineer the tunneling probability of carriers in the impurity diffusion barrier layer, in devices such as multiple quantum well (MQW) ultraviolet light emitting diode devices. The barrier layer of the invention may also be employed in specific device applicatons to localize dopants in interfacial regions where a high degree of strain or other material differences may be present, to yield highly doped regions for contact formation. The barrier layer structure of the invention alternatively may be employed to effect channel definition, in order to optimize the performance of the device including such barrier layer.

While the invention has been described herein with reference to specific aspects, features and embodiments, it will be recognized that the invention is not thus limited, but rather extends to and encompasses other variations, modifications and alternative embodiments. Accordingly, the invention is intended to be broadly interpreted and construed to encompass all such other variations, modifications, and alternative embodiments, as being within the scope and spirit of the invention as hereinafter claimed.

What is claimed is:

1. A III-nitride optoelectronic device structure comprising:
a dopant-containing doped III-nitride layer;
an active region; and
a barrier layer disposed between the doped III-nitride layer and the active region, said barrier layer being formed of a material comprising ALGaN having at least 50% Al, based on the total amount of Al and Ga therein; characterized by any of the following:
(a) the optoelectronic device structure comprises any of a UV LED and a UV laser diode; and
(b) any of the barrier layer and a portion of the doped III-nitride layer contains the dopant in a concentration that varies with depth, with a dopant concentration having a local maximum along an interface between the barrier layer and the doped III-nitride layer.

2. The III-nitride optoelectronic device structure of claim 1, wherein said concentration of Al is in a range of from about 60% to 100%.

3. The III-nitride optoelectronic device structure of claim 1, wherein said concentration of Al is in a range of from about 75% to 100%.

4. The III-nitride optoelectronic device structure of claim 1, wherein said concentration of Al is in a range of from about 80% to 100%.

5. The III-nitride optoelectronic device structure of claim 1, wherein said concentration of Al is in a range of from about 90% to 100%.

6. The III-nitride optoelectronic device structure of claim 1, wherein said concentration of Al is in a range of from about 95% to 100%.

7. The III-nitride optoelectronic device structure of claim 1, wherein said ALGaN layer has a thickness of from about 5 Angstroms to about 200 Angstroms.

8. The III-nitride optoelectronic device structure of claim 1, wherein said ALGaN layer has a thickness of from about 10 Angstroms to about 100 Angstroms.

9. The III-nitride optoelectronic device structure of claim 1, wherein said ALGaN layer has a thickness of from about 10 Angstroms to about 75 Angstroms.

10. The III-nitride optoelectronic device structure of claim 1, wherein said ALGaN layer has a thickness of from about 10 Angstroms to about 60 Angstroms.

11. The III-nitride optoelectronic device Structure of claim 1, wherein said device structure comprises a UV LED.

12. The III-nitride optoelectronic device structure of claim 1, wherein said device structure comprises a MQW UV LED.

13. The III-nitride optoelectronic device structure of claim 1, wherein:
said device structure comprises a blue or green LED; and
any of the barrier layer and a portion of the doped III-nitride layer contains the dopant in a concentration that varies with depth, with a dopant concentration having a local maximum along an interface between the barrier layer and the doped III-nitride layer.

14. The III-nitride optoelectronic device structure of claim 1, wherein:
said device structure comprises a blue laser diode; and
any of the barrier layer and a portion of the doped III-nitride layer contains the dopant in a concentration that varies with depth, with a dopant concentration having a local maximum along an interface between the barrier layer and the doped III-nitride layer.

15. The III-nitride optoelectronic device structure of claim 1, wherein said ALGaN layer comprises AIN.

16. The III-nitride optoelectronic device structure of claim 1, wherein said doped III-nitride layer comprises an n-AlGaN layer.

17. The III-nitride optoelectronic device structure of claim 1, wherein said doped III-nitride layer comprises an Mg-doped p-AlGaN layer.

18. The III-nitride optoelectronic structure of claim 1, further comprising a sapphire substrate.

19. The III-nitride optoelectronic structure of claim 1, further comprising a GaN substrate.

20. The III-nitride optoelectronic device structure of claim 1, wherein said dopant comprises at least one dopant species selected from the group consisting of Si, Mg, Be. Fe, Zn, O and Ge.

21. The III-nitride optoelectronic device structure of claim 1, wherein said dopant comprises at least one dopant species selected from the group consisting of Mg and Si.

22. A III-nitride electronic device structure including dopant-containing doped material, an active region, and a barrier material arranged between the doped material and the active region, wherein:
the barrier material comprises high-Al content $Al_xGa_yN$, with x+y=1, and x>0.50; and
any of the barrier material and a portion of the doped material contains the dopant in a concentration that varies with depth, with a dopant concentration having a local maximum alone an interface between the barrier material and the doped material.

23. The III-nitride optoelectronic device structure of claim 1, wherein said device structure comprises a UV laser diode.

24. The III-nitride optoelectronic device structure of claim 1, wherein any of the barrier layer and a portion of the doped III-nitride layer contains the dopant in a concentration that varies with depth, with a dopant concentration having a local maximum along an interface between the barrier layer and the doped III-nitride layer.

25. The III-nitride optoelectronic device structure of claim 1, wherein the barrier layer material comprises an epitaxially grown crystal.

26. The III-nitride optoelectronic device structure of claim 1, wherein the active region is non-Indium-containing.

27. The III-nitride optoelectronic device structure of claim 1, wherein the doped III-nitride layer comprises ALGaN, the active region comprises ALGaN, and the barrier layer comprises AIN.

28. The III-nitride electronic device structure of claim 22, wherein the active region contains Al.

29. The III-nitride electronic device structure of claim 22, wherein the doped material comprises ALGaN, the active region comprises ALGaN, and the barrier material comprises AIN.

30. The III-nitride electronic device structure of claim 22, wherein said device structure comprises a heterojunction bipolar transistor.

* * * * *

UNITED STATES PATENT AND TRADEMARK OFFICE
CERTIFICATE OF CORRECTION

PATENT NO.       : 7,282,744 B2
APPLICATION NO.  : 10/840515
DATED            : October 16, 2007
INVENTOR(S)      : Jeffrey S. Flynn et al.

It is certified that error appears in the above-identified patent and that said Letters Patent is hereby corrected as shown below:

Column 1, line 11: "High Al AlGan" should be -- High Al AlGaN --.

Column 3, line 8: "AIN" should be -- AlN --.

Column 3, line 21: "AIN" should be -- AlN --.

Column 3, line 25: "AIN" should be -- AlN --.

Column 6, line 20: "k'a $\underline{>>}$ 1" should be -- k'a >> 1 --.

Column 9, line 10 (claim 1): "ALGaN" should be -- AlGaN --.

Column 9, line 36 (claim 7): "ALGaN" should be -- AlGaN --.

Column 9, line 39 (claim 8): "ALGaN" should be -- AlGaN --.

Column 9, line 42 (claim 9): "ALGaN" should be -- AlGaN --.

Column 9, line 45 (claim 10): "ALGaN" should be -- AlGaN --.

Column 9, line 47 (claim 11): "Structure" should be -- structure --.

Column 10, line 5 (claim 15): "ALGaN layer comprises AIN" should be -- AlGaN layer comprises AlN --.

UNITED STATES PATENT AND TRADEMARK OFFICE
CERTIFICATE OF CORRECTION

PATENT NO. : 7,282,744 B2
APPLICATION NO. : 10/840515
DATED : October 16, 2007
INVENTOR(S) : Jeffrey S. Flynn et al.

It is certified that error appears in the above-identified patent and that said Letters Patent is hereby corrected as shown below:

Column 10, lines 51-52 (claim 27): "ALGaN, the active region comprises ALGaN, and the barrier layer comprises AlN" should be -- AlGaN, the active region comprises AlGaN, and the barrier layer comprises AlN --.

Column 10, lines 56-58 (claim 29): "ALGaN, the active region comprises ALGaN, and the barrier layer comprises AlN" should be -- AlGaN, the active region comprises AlGaN, and the barrier layer comprises AlN --.

Signed and Sealed this

Twenty-fifth Day of March, 2008

JON W. DUDAS
*Director of the United States Patent and Trademark Office*